United States Patent [19]

Yashiro et al.

[11] 4,045,732
[45] Aug. 30, 1977

[54] DEVICE FOR SENSING THE OPERATIVE STATUS OF ELECTRICAL EQUIPMENT

[75] Inventors: Kenji Yashiro; Yoshifumi Saeki, both of Tokyo, Japan

[73] Assignee: Pioneer Electronic Corporation, Tokyo, Japan

[21] Appl. No.: 655,157

[22] Filed: Feb. 4, 1976

[30] Foreign Application Priority Data

Sept. 2, 1975  Japan .................................. 50-106392

[51] Int. Cl.² ............................................ G01R 19/16
[52] U.S. Cl. .................................... 324/133; 307/351; 324/103 P; 324/140 D
[58] Field of Search .................... 324/103 P, 132, 127, 324/133, 140 R, 140 D; 307/235 A, 235 J; 328/148, 163

[56]  References Cited

U.S. PATENT DOCUMENTS

| | | | |
|---|---|---|---|
| 2,871,447 | 1/1959 | Hall | 324/132 X |
| 3,434,053 | 3/1969 | McKee | 324/132 |
| 3,502,983 | 3/1970 | Ingle et al. | 324/140 D |
| 3,502,993 | 3/1970 | Schurzinger | 328/163 |
| 3,732,492 | 5/1973 | Geul | 324/103 P |
| 3,777,262 | 12/1973 | Vahlstrom et al. | 324/103 P |
| 3,777,263 | 12/1973 | Perron et al. | 324/103 P |
| 3,867,702 | 2/1975 | Tropie et al. | 307/235 AX |
| 3,885,168 | 5/1975 | Matsuzaki | 307/235 A |

*Primary Examiner*—Gerard R. Strecker
*Attorney, Agent, or Firm*—Fraser and Bogucki

[57]  ABSTRACT

The operative status of an electrical apparatus unit such as a television receiver, incorporating an AC-DC converter, and drawing a substantial amount of current is sensed while differentiating from the usage of a lower amount of current, as when operating in a standby mode. The sensor distinguishes between the standby current waveform and a distinctly different current waveform generated when the AC-DC converter draws current in the mode in which full power is on. The sensor incorporates a reference current detector responsive to the mean of the absolute value of alternating current flowing through a power line to the electrical unit, and a peak value current detector responsive to the peak value of the periodic signal on the power line. A comparator circuit receives outputs from both detectors, and provides an output signal when the ratio therebetween is in excess of a predetermined value, this condition only applying when the AC-DC converter is operative. The comparator may comprise a differential amplifier which periodically triggers a pulse generator to maintain a selected signal level and activate a relay as long as the selected proportionality exists between the peak and mean values of the AC power signal.

8 Claims, 4 Drawing Figures

FIG. 1
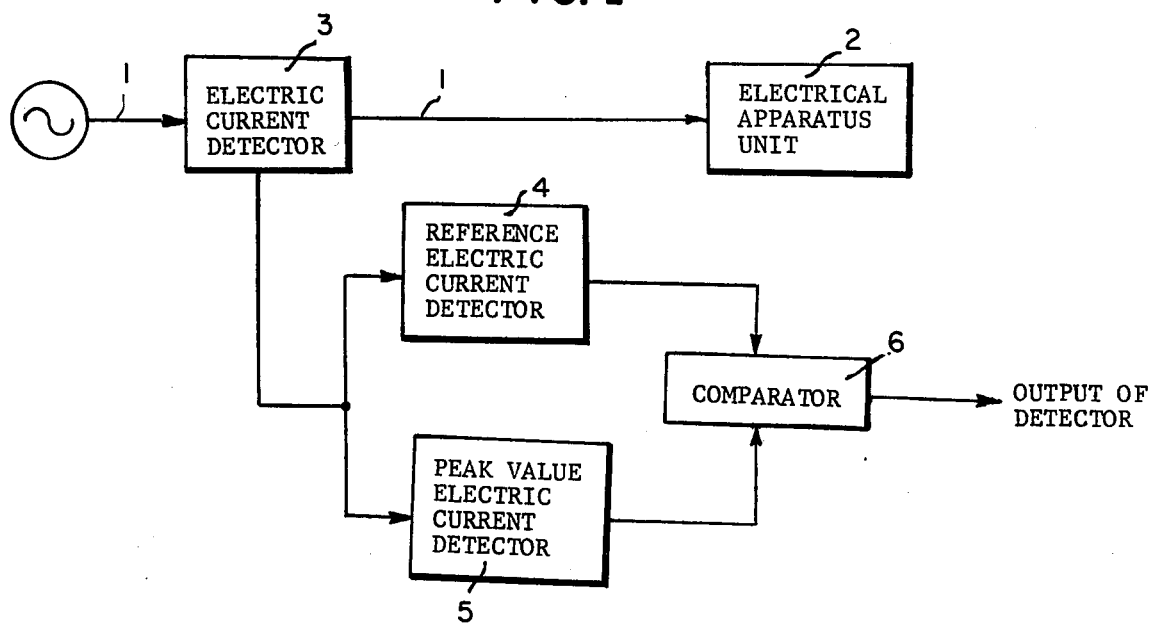
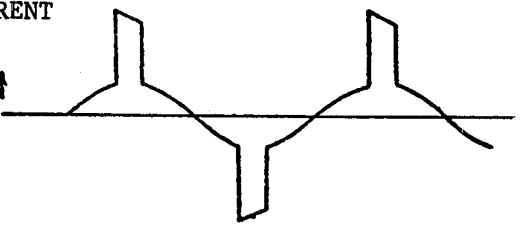
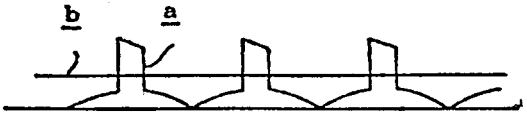

DEVICE FOR SENSING THE OPERATIVE STATUS OF ELECTRICAL EQUIPMENT

BACKGROUND OF THE INVENTION

This invention relates to a device for sensing the operative status of an electrical apparatus unit which is provided with an AC-DC converter, the sensor being adapted to distinguish between conditions of operation and non-operation (including a standby condition).

In prior art devices, the operating condition of an electrical apparatus unit has been sensed by detecting the presence of an electric current supplied to the unit or by detecting whether an amount of an electric current is in excess of a reference value or not. However, different electrical apparatus units are different in their electric current consumption according to classes and conditions of use thereof. Further, various apparatuses are each different in operating electric current and non-operating electric current modes, such as, for example, those that use a small flow of electric current in order to place the apparatus in a standby condition (for example, a television set having a preheat function). For example, there is one type of electrical apparatus which consumes only a minute amount of electric current even though it is in an operating condition, while there are others which consume an electric current more than the aforesaid minute amount of electric current to maintain the apparatus in a standby condition. Therefore, conventional sensing devices, which detect the operation or non-operation of electrical apparatus merely from the presence or magnitude or an amount of electric current, cannot be employed with devices for which the reference values must be adjusted or in which partial power consumption must be distinguished from normal operation.

SUMMARY OF THE INVENTION

The present invention provides an improved system for distinguishing between different operative states of electrical apparatus devices, based upon the conception that such devices when provided with an AC-DC converter produce a difference in power source electric current waveform between the operating condition and the non-operating condition. In a particular example of a system in accordance with the invention, the differences in such waveform are determined by comparing an average or mean waveform amplitude with the peak waveform signal, as in a differential amplifier, to provide an output signal only when the ratio is in excess of a predetermined amount. Further, the pulse output signal derived from comparison of successive half waves of the power source signal may be utilized to generate a momentary signal to actuate a pulse generator which charges an integrating circuit controlling an associated relay so as to provide an output signal as long as power usage continues, without erroneous response to transient noise spikes.

BRIEF DESCRIPTION OF THE DRAWINGS

A better understanding of the invention may be had by reference to the following description, taken in conjunction with the accompanying drawings, in which:

FIG. 1 is a block diagram showing one example of a device for sensing an operating condition of electrical apparatus in accordance with the present invention;

FIG. 2 is a graphical representation of electric current waveforms used in explaining the operation of the device of FIG. 1.

DETAILED DESCRIPTION OF THE INVENTION

Figure 3:
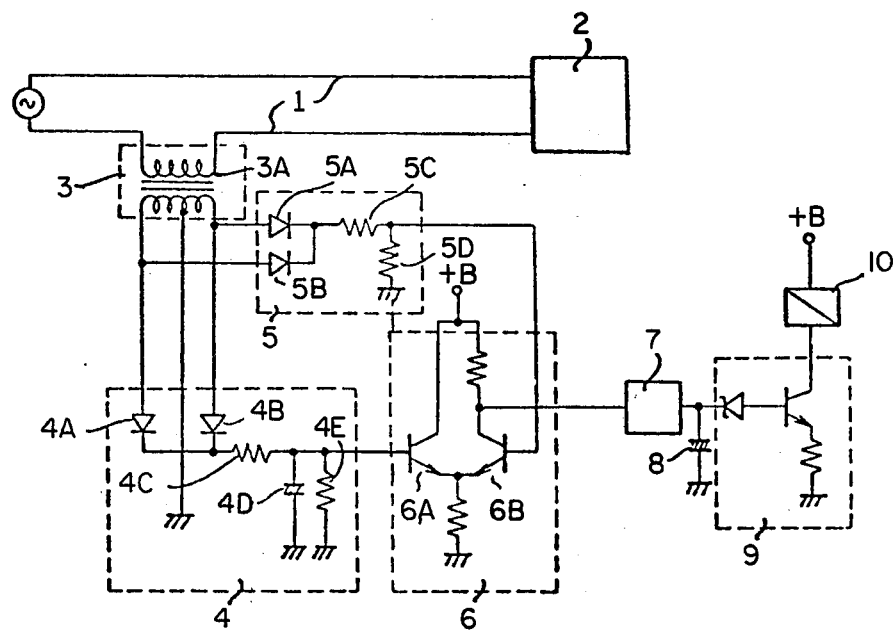
FIG. 3 is a schematic diagram of a specific circuit in accordance with the invention.

FIG. 1 is a block diagram showing one embodiment of a device for sensing an operating condition of electrical apparatus in accordance with the present invention. The device comprises an AC power source line 1 for the electrical apparatus 2, an electric current detector 3 for detecting the electric current flowing through the power source line 1, a reference electric current detector 4 for obtaining a mean value of electric current detected by the electric current detector 3, a peak value electric current detector 5 for obtaining a peak value of electric current detected by the electric current detector 3, and a comparator 6 for comparing an output of the reference electric current detector 4 with an output of the peak electric current detector 5.

In the arrangement as described above, the electrical apparatus 2 obtains a DC current from an AC current supplied from the power source line 1 through an incorporated AC-DC converter (for example, diode bridge rectifier and smoothing condenser), the DC current being supplied to the internal circuits of the apparatus. Since the electric current flowing in the power source line 1 is to supply the electric power consumed due to operation of the electrical apparatus 2, the electric current waveform thereof is a pulse electric current flowing due to conduction of the rectifying diodes in the vicinity of the peak of the sinusoidal electric current flowing through the quasi-resistive portions of the apparatus, as shown in FIG. 2(a). Therefore, when the electrical apparatus 2 is in a condition of normal operation, the electric current detector 3 will detect an electric current having a waveform shown in FIG. 2(a). From this current, an output having a waveform shown at $a$ in FIG. 2(b) is obtained in the peak value electric current detector 5 and an output having a waveform shown at $b$ in FIG. 2(b) is obtained in the reference electric current detector 4, whereby an output of the comparator 6 is reversed by the pulse electric current. Both waveforms represent absolute values (i.e. unidirectional signals) of the applied power signal. In contrast, when the electrical apparatus 2 is in a condition of non-operation or in a condition of stand-by, the output of the peak value electric current detector 5 is a sine wave electric current without a pulse electric current and is lower in level than the output of the reference electric current detector 4 so that the output of the comparator 6 is not reversed. As a result, the condition of operation or non-operation (including stand-by condition) of the electrical apparatus 2 may be sensed according to an output condition of the comparator 6. Thus, the output of the reference electric current detector 4, which serves as a reference of comparison, may be varied according to the electric current consumed by the electrical apparatus 2 connected to thereby obtain a reference electric current value in conformity with the electrical apparatus 2 so as to be able to securely sense the operation and non-operation of the electrical apparatus as desired.

FIG. 3 is a circuit representation showing an embodiment of a device for sensing an operating condition of electrical apparatus according to the present invention, in which dotted line blocks indicate corresponding parts in FIG. 1. In this figure, the electric current detector 3 comprises an electric current detector transformer 3A of which the primary is connected in series to the power source line 1, and the reference electric current detector 4 comprises an arrangement in which secondary outputs of the electric current detector transformer 3A are subjected to full-wave rectification by diodes 4A and 4B and smoothed by resistor 4C and capacitor 4D. It should be noted that resistor 4E constitutes a division circuit in cooperation with resistor 4C and also discharges an electric charge from capacitor 4D. Next, the peak value electric current detector 5 comprises an arrangement in which secondary outputs of the electric current detector transformer 3A are subjected to full-wave rectification by diodes 5A and 5B and divided by resistors 5C and 5D connected in series with each other. The comparator 6 comprises a differential amplifier composed of transistors 6A, 6B and the like. In FIG. 3, the reference numeral 7 designates a unistable multivibrator adapted to feed pulses of a predetermined width in response to a pulse output from the comparator 6, a capacitor 8 to smooth the output of the unistable multivibrator 7, a switch circuit 9 which is turned ON when a charging voltage of the capacitor 8 exceeds a predetermined level (determined by the ON voltage of Zener diode and transistor), and a relay 10 excited when the switch circuit 9 is turned ON.

In the arrangement as described above, the ratio of voltage division between resistors 5C and 5D and the ratio of voltage division between resistors 4C and 4E are set so that when the electrical apparatus 2 is in a condition of non-operation, the transistor 6B is maintained in the OFF condition. That is, they are set in such a way that if the electric current flowing through the power source line 1 is a sine wave, the DC output of the reference electric current detector 4 is always higher in level than the output having a full-wave rectification waveform of the peak value electric current detector 5. With such a setting procedure, only when the pulse electric current is superposed on the current flowing in the power source line 1, the transistor 6B is turned ON and the unistable multivibrator 7 is triggered to charge the capacitor 8. Several cycles of such operation are repeated until the charging voltage of the capacitor 8 is reached, and as a consequence the switch circuit 9 is turned ON to activate the relay 10. This activation of relay 10 indicates that the electrical apparatus 2 is in a condition of operation. The capacitor 8 is provided to prevent the sensor device from being erroneously operated when an unexpected noise pulse is induced into the power source line 1.

While the peak value electric current detector and mean value electric current detector with the detected electric current subjected to full-wave rectification have been illustrated in the above-mentioned embodiment, it is to be understood that half-wave rectification may also be employed.

As is obvious from the foregoing, the present invention provides a device for sensing an operating condition of electrical apparatus, wherein utilization of a difference in power source electric current waveform between the operating condition and the non-operating condition of electrical apparatus is made to compare a mean value with a peak value of the power source electric current thereby sensing the operation and non-operation of the electrical apparatus. Accordingly, a device according to the invention is a sensor device which is capable of automatically obtaining a compared reference value in conformity with a consumption current of electrical apparatus, and capable of securely sensing the operation and non-operation of electrical apparatus irrespective of magnitude of the consumption current thereof.

What is claimed is:

1. A device for sensing the energization condition of an electrical apparatus including an AC-DC converter circuit from at least one power line for the apparatus, comprising:
    first amplitude detector means responsive to the current in the power line for generating a mean value signal indicative of the mean value of said current;
    second amplitude detector means responsive to the current in the power line for generating a peak value signal indicative of the peak value of said current, the peak value signal being substantially greater in a first mode when the AC-DC converter is utilized than in a second mode when the converter is not utilized; and
    comparator means responsive to the mean value signal and peak value signal for indicating the existence of an energized condition for the electrical apparatus when there is greater than a selected ratio between the peak value and mean value signals.

2. The invention as set forth in claim 1 above, wherein said device further comprises means in series circuit with the power line for the electrical apparatus for detecting the current waveform, wherein said first amplitude detector means provides an integrated signal and said second amplitude detector means provides a signal varying with the absolute value of the current waveform, and wherein said device further comprises means responsive to said comparator means for providing a steady state indication of the energization condition of the electrical apparatus.

3. A device for sensing the energization condition of an electrical apparatus including an AC-DC converter circuit from at least one power line to the apparatus, comprising:
    means in series circuit with the power line for the electrical apparatus for detecting the current waveform of current therein;
    first amplitude detector means responsive to the detected current waveform, the first amplitude detector means including a first terminal, rectifier means, capacitor means and first voltage divider means coupled to provide to the first terminal an integrated mean absolute value signal varying with the integrated mean absolute value of the detected current waveform;
    a second amplitude detector means responsive to the detected current waveform, the second amplitude detector means including a second terminal, rectifier means, and second voltage divider means coupled to provide to the second terminal a peak value signal varying with the peak absolute value of the detected current waveform;
    comparator means responsive to the mean value signal and peak value signal for indicating the existence of an energized condition for the electrical apparatus when there is greater than a selected ratio between the peak value and mean value signals, the comparator means including differential amplifier means coupled to receive signals from the first and second terminals and to provide an output signal when the voltage at the second terminal is greater than that at the first terminal, the ratio of voltages at the second and first terminals being selected to provide an output signal from said differential amplifier means only when an impulse peak signal arising from operation of the AC-DC converter is superposed on the power line signals; and means responsive to said comparator means for providing a steady state indication of the energization condition of the electrical apparatus.

4. The invention as set forth in claim 3 above, including in addition pulse generator means responsive to the output from said differential comparator means, integrating means coupled to integrate the output signal from the pulse generator means, and switching signal means responsive to the output level of the integrating means for providing an output signal when the output level of the integrating means is in excess of a selected threshold level.

5. The invention as set forth in claim 3 above, wherein said first and second voltage divider means each comprise a pair of resistor means having a midpoint output terminal therebetween, and wherein said differential amplifier means has first and second inputs coupled to said midpoint terminals of said first and second voltage divider means respectively, and wherein said differential amplifier means includes an output transistor which is arranged to be conductive when the selected ratio between the peak absolute value signal and the mean absolute value signal exists.

6. A system for distinguishing the full energization condition of an electrical unit including an AC-DC converter from a standby condition in which alternating current is drawn without activation of the AC-DC converter to superpose a pulse peak on the alternating current waveform, comprising:

means coupled in circuit with the electrical unit for sensing the current waveform thereat;

means responsive to the ratio between the peak level of the absolute value of the sensed current and the mean level of the absolute value of the sensed current for providing a pulse output for each half-cycle in which greater than a selected ratio exists;

means responsive to the pulse outputs from the ratio responsive means for generating a control voltage whose amplitude is responsive to the number of pulse outputs received in a predetermined time; and means responsive to the control voltage for generating a steady state output signal when the control voltage is in excess of a predetermined level.

7. The invention as set forth in claim 6 above, wherein said ratio responsive means comprises a unistable multivibrator coupled to charge an integrating capacitor to provide the control voltage.

8. The invention as set forth in claim 7 above, wherein said means for generating a control voltage comprises switch means coupled to be conductive in response to a selected level of control voltage, and relay means responsive to conduction of said switch means.

* * * * *